United States Patent
Akimoto et al.

(10) Patent No.: US 9,768,183 B2
(45) Date of Patent: Sep. 19, 2017

(54) SOURCE LINE FORMATION AND STRUCTURE

(71) Applicant: SANDISK TECHNOLOGIES LLC, Plano, TX (US)

(72) Inventors: Shunsuke Akimoto, Yokkaichi (JP); Hidetoshi Nakamoto, Yokkaichi (JP); Keita Kumamoto, Yokkaichi (JP); Hidehito Koseki, Yokkaichi (JP); Yuji Takahashi, Yokkaichi (JP); Noritaka Fukuo, Yokkaichi (JP); Tomoyasu Kakegawa, Yokkaichi (JP); Takuya Futase, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 112 days.

(21) Appl. No.: 14/713,579

(22) Filed: May 15, 2015

(65) Prior Publication Data

US 2016/0336335 A1 Nov. 17, 2016

(51) Int. Cl.
| | |
|---|---|
| *H01L 29/788* | (2006.01) |
| *H01L 29/40* | (2006.01) |
| *H01L 21/44* | (2006.01) |
| *H01L 21/336* | (2006.01) |
| *H01L 27/11524* | (2017.01) |
| *H01L 29/66* | (2006.01) |

(52) U.S. Cl.
CPC .. *H01L 27/11524* (2013.01); *H01L 29/66825* (2013.01)

(58) Field of Classification Search
CPC ......... H01L 27/11524; H01L 27/11521; H01L 27/115; H01L 29/42328; H01L 21/76802; H01L 21/76838; H01L 21/76877; H01L 21/76892
USPC ... 257/314, 315, 316, 774, E27.103, E21.69, 257/E21.585; 438/675, 257
See application file for complete search history.

(56) References Cited

U.S. PATENT DOCUMENTS

| | | | |
|---|---|---|---|
| 5,604,158 A | 2/1997 | Cadien et al. | |
| 6,103,623 A | 8/2000 | Lien et al. | |
| 2008/0179746 A1 | 7/2008 | Hur et al. | |
| 2009/0227080 A1* | 9/2009 | Jeon | H01L 21/76802 438/257 |
| 2012/0086057 A1* | 4/2012 | Kim | H01L 27/11521 257/288 |

* cited by examiner

*Primary Examiner* — Fernando L Toledo
*Assistant Examiner* — Aaron Gray
(74) *Attorney, Agent, or Firm* — Foley & Lardner LLP

(57) ABSTRACT

An initial etch forms a trench over first contact areas of a plurality of NAND strings, the initial etch also forming individual openings over second contact areas of the plurality of NAND strings. Material is added in the trench to reduce an area of exposed bottom surface of the trench while maintaining the individual openings without substantial reduction of bottom surface area. Subsequent further etching extends the trench and the plurality of individual openings.

15 Claims, 12 Drawing Sheets

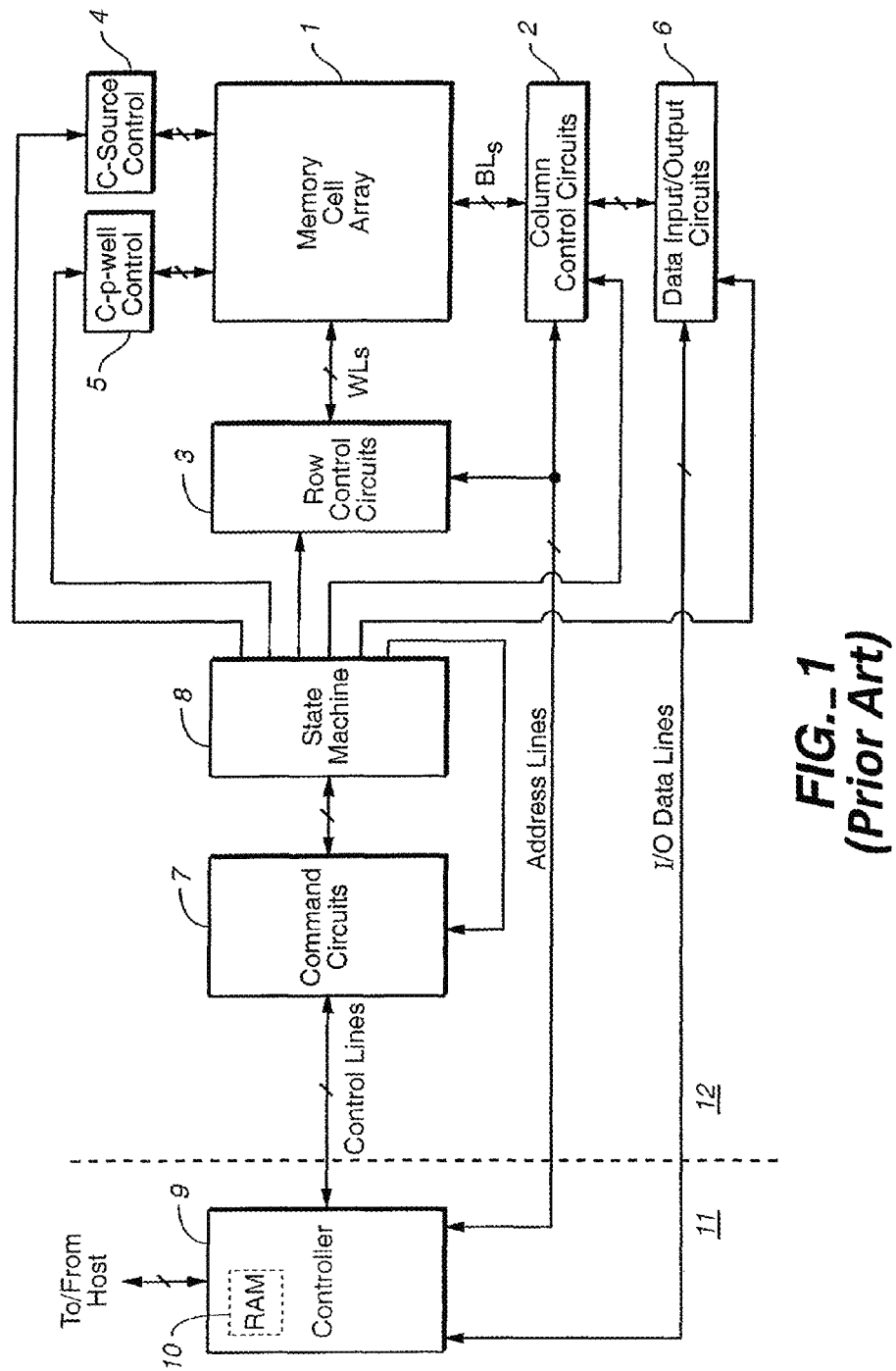
FIG._1
*(Prior Art)*

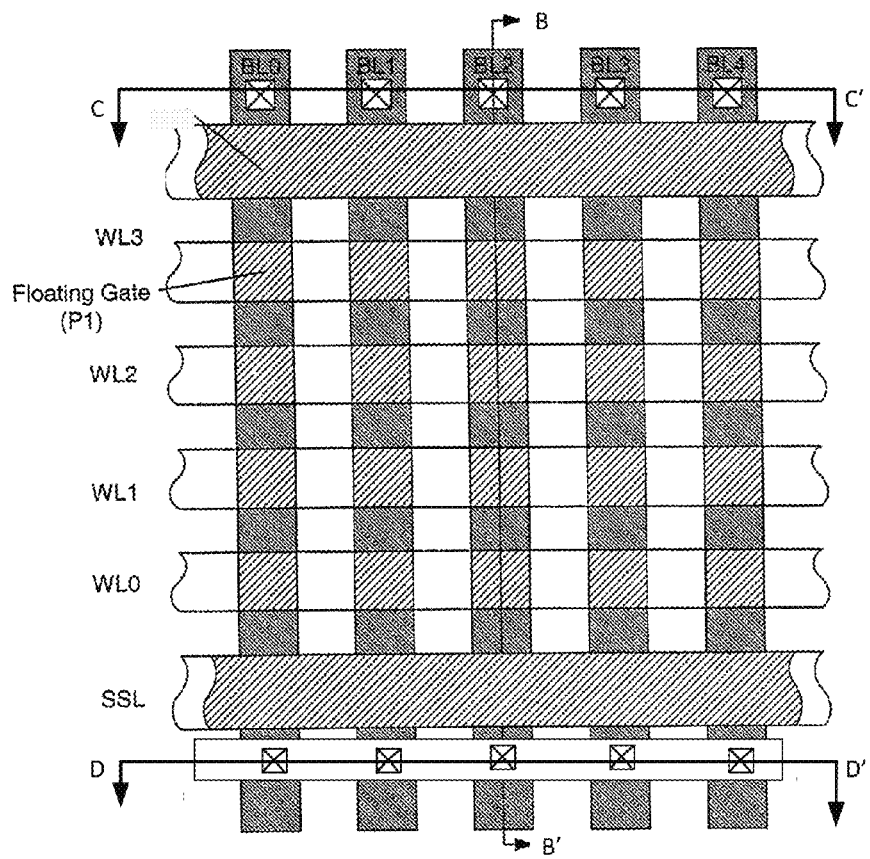
FIG._2A (PRIOR ART)
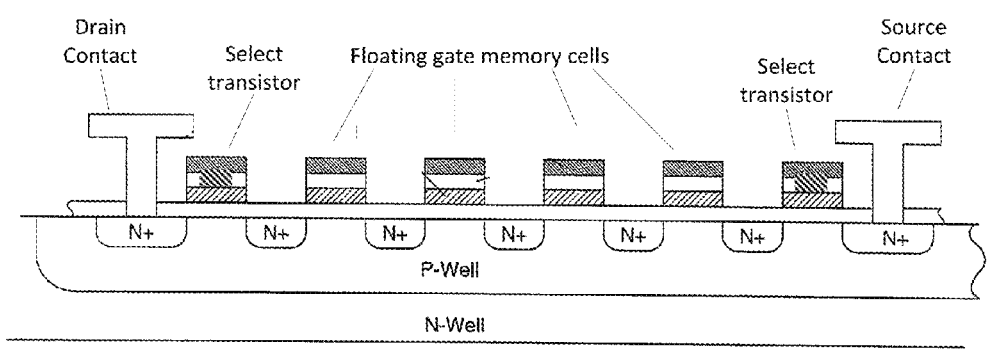
FIG._2B (PRIOR ART)
(Section A-A)

(Section B-B)

(Section B-B)

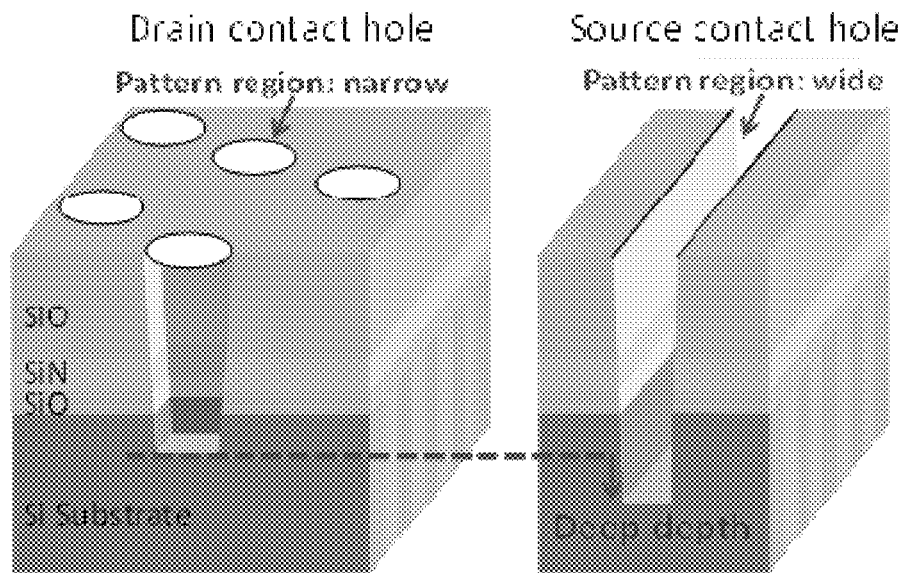
FIG. 3A (Prior Art)
FIG. 3B (Prior Art)
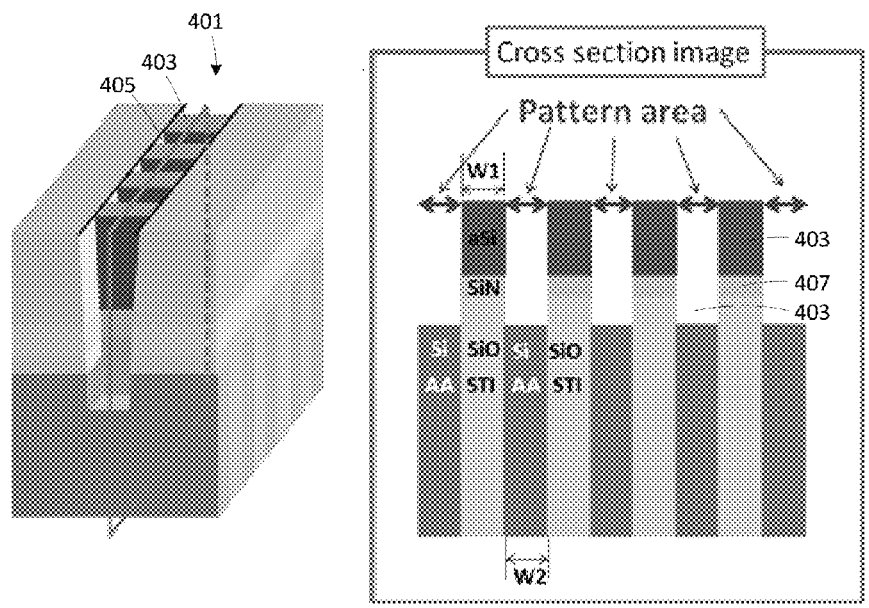
FIG. 4A
FIG. 4B

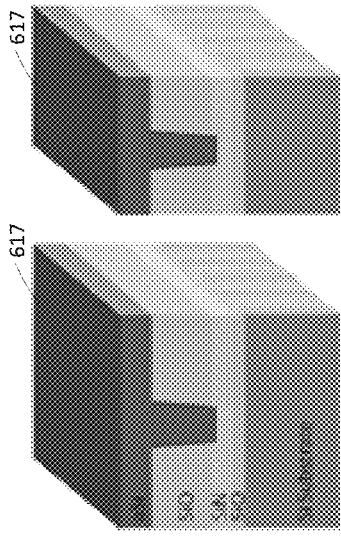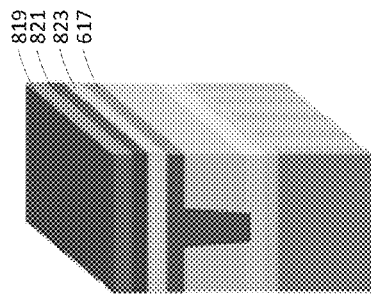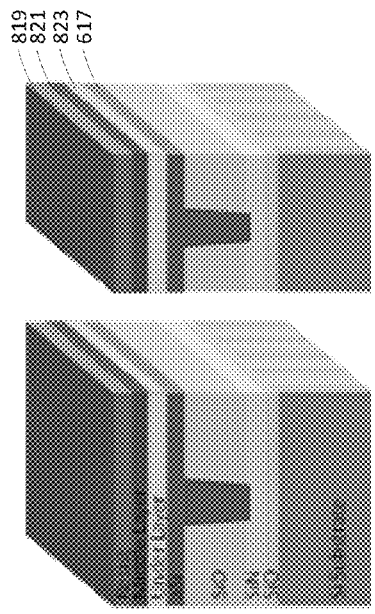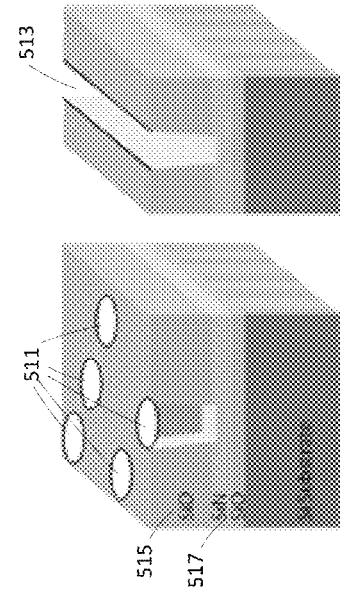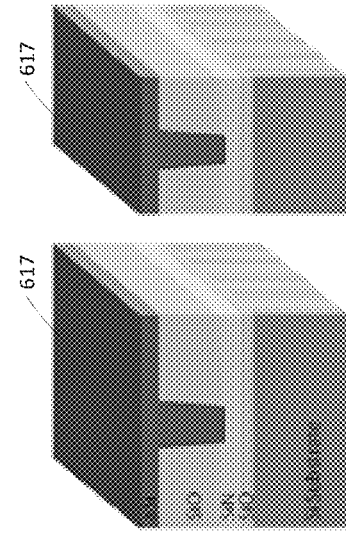

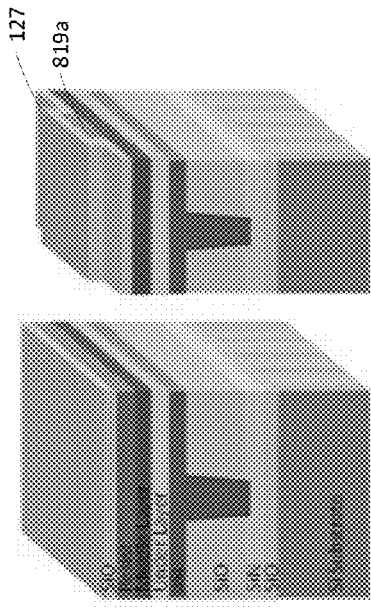
FIG. 9A    FIG. 9B
FIG. 10A   FIG. 10B
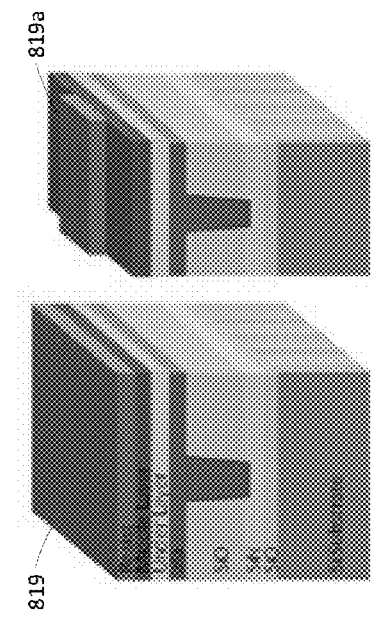
FIG. 11A   FIG. 11B
FIG. 12A   FIG. 12B
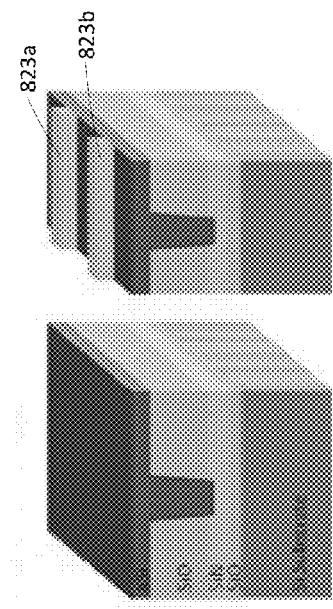
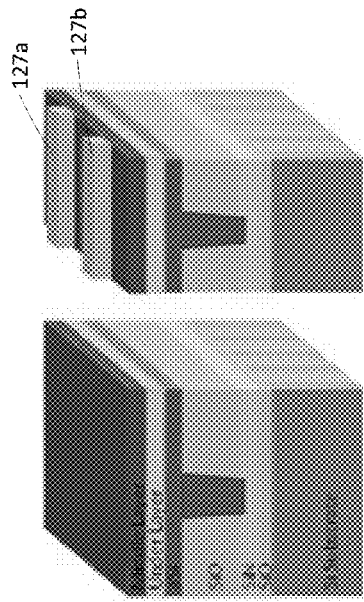

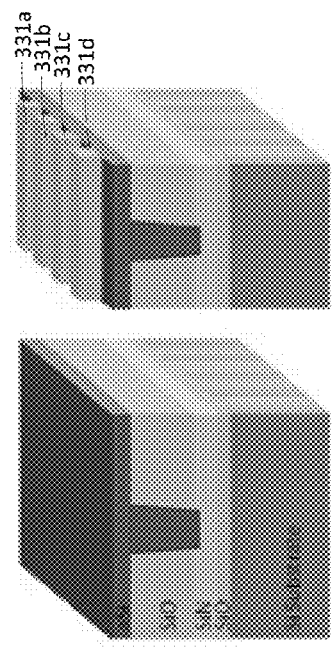
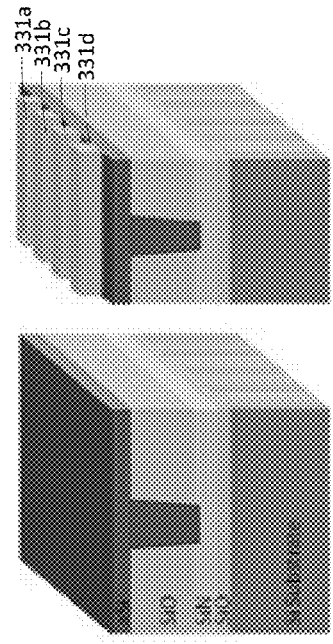
FIG. 13A FIG. 13B FIG. 14A FIG. 14B
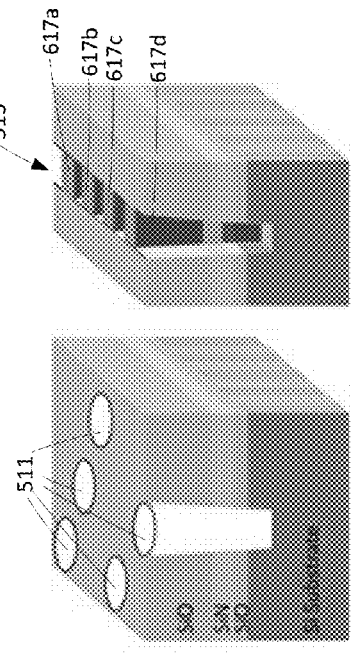
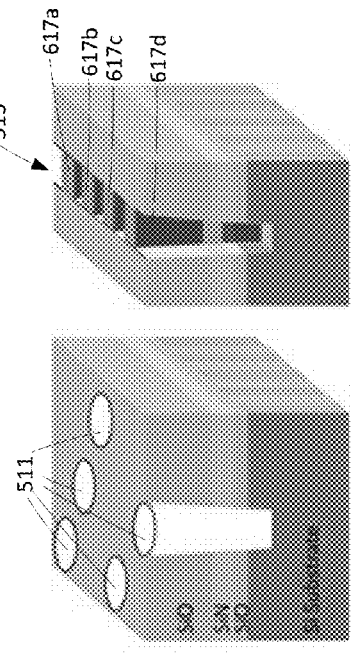
FIG. 15A FIG. 15B FIG. 16A FIG. 16B

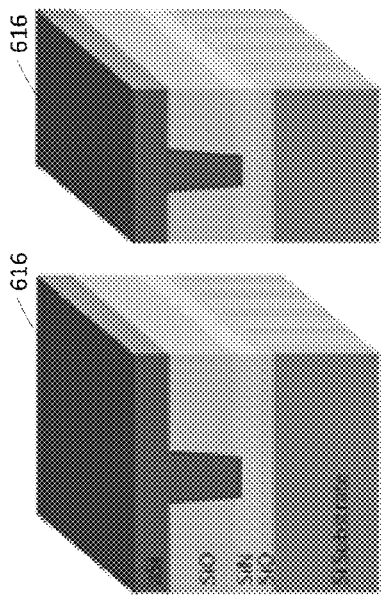
FIG. 18A  FIG. 18B  FIG. 19A  FIG. 19B
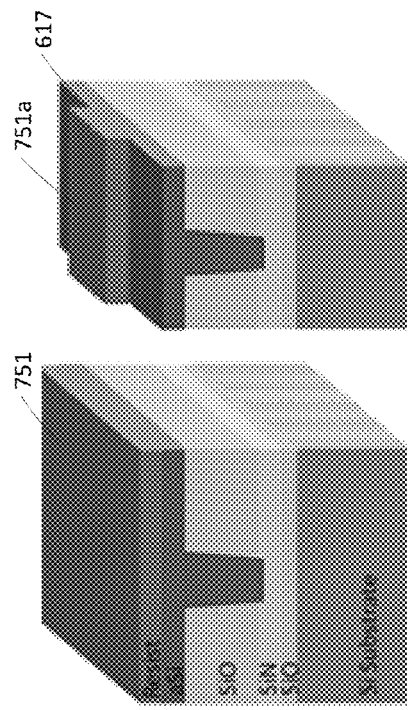
FIG. 21A  FIG. 21B
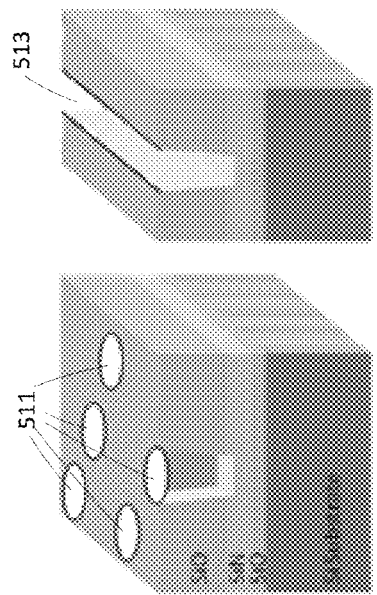
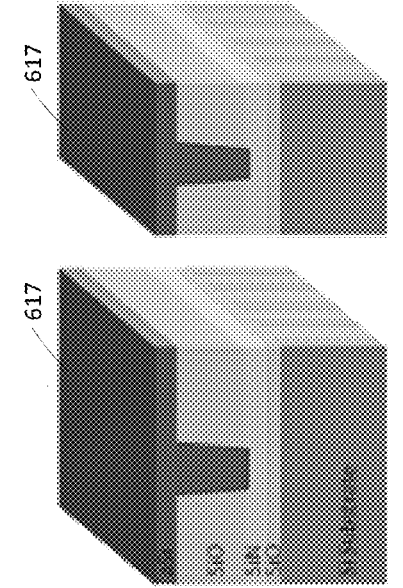
FIG. 20A  FIG. 20B

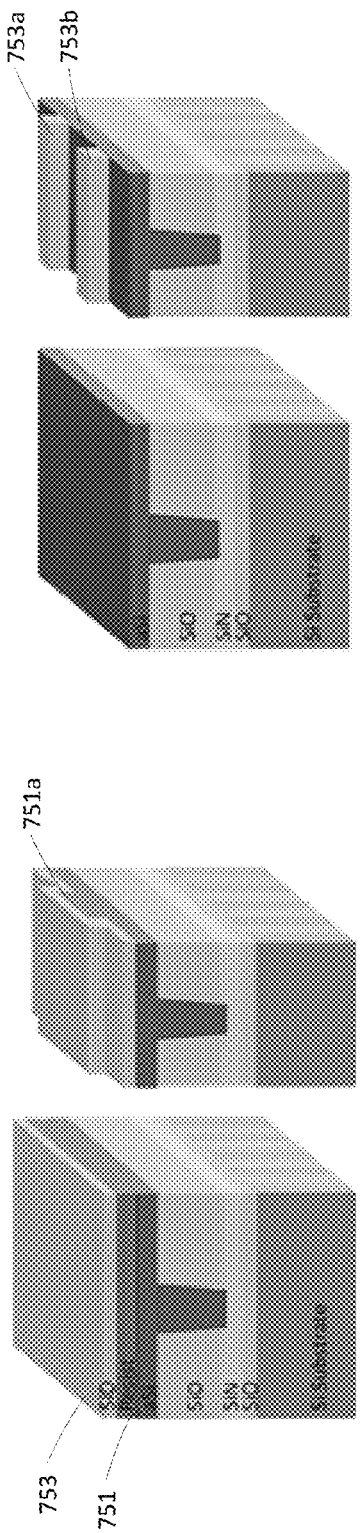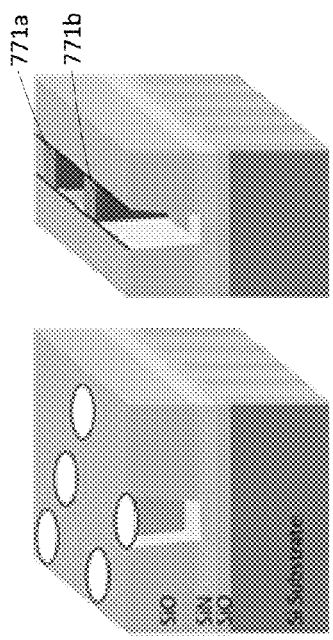
FIG. 23B  FIG. 23A  FIG. 24B  FIG. 22B  FIG. 24A  FIG. 22A

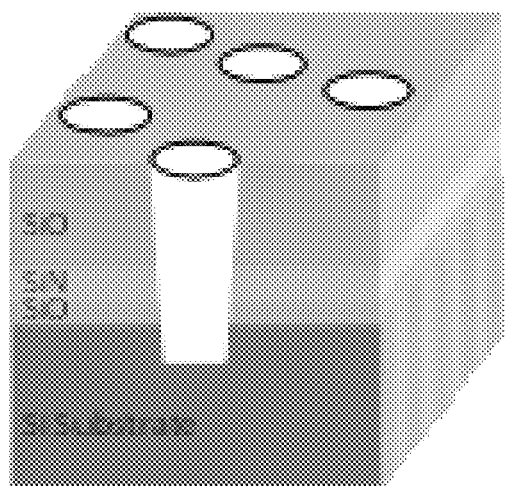
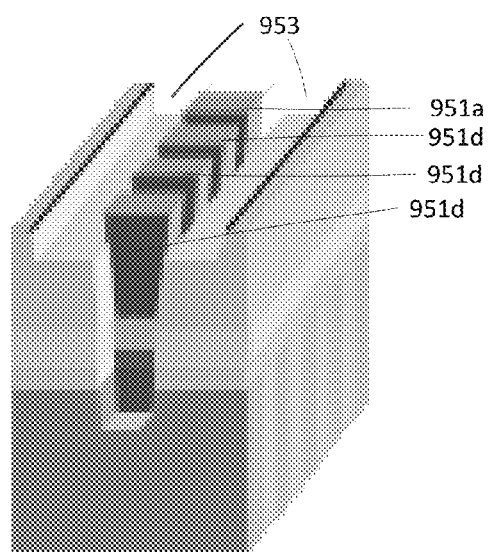
FIG. 25A  FIG. 25B
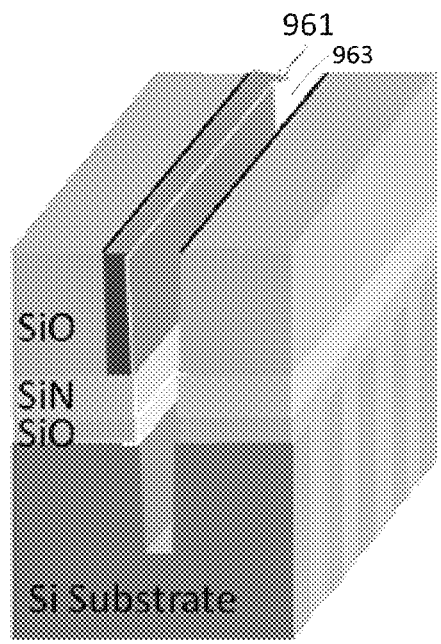
FIG. 26

SOURCE LINE FORMATION AND STRUCTURE

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a prior art flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of a string connect to a global bit line and a common source line respectively through select transistors (source select transistor and drain select transistor). Select transistors are used to connect NAND strings to control circuits when they are to be accessed, and to isolate them when they are not being accessed. Select transistors may be larger than the transistors that form nonvolatile memory cells and select lines may be wider than word lines. In general, it is desirable to form both word lines (which are relatively narrow) and select lines (which are relatively wide) in the same layer or layers using a common pattern.

At either end of a NAND string there is a contact area formed in the silicon substrate to allow the NAND string to be electrically connected. Contact areas in FIG. 2B are N+ doped areas in the substrate formed by implantation in a P-well. A drain contact formed of metal contacts the contact area on the drain side of the NAND string and a source contact also formed of metal contacts the contact area on the source side of the NAND string. Forming such contacts presents various problems as device sizes scale to ever-smaller dimensions.

SUMMARY

In some NAND flash memories, a common source line is formed by depositing conductive metal in a trench that extends perpendicular to the direction of the NAND strings exposing source contact areas, while drain contacts are formed by depositing the metal in individual openings that expose drain contact areas. Forming the trench and the individual openings in the same etch process tends to produce deeper etching in the trench because of the micro-loading effect. Uniformity may be achieved by performing an initial etch down to an etch stop layer, then filling the trench and individual openings with conductive material. Patterning may then allow removal of all conductive material from the individual openings and from over source contact areas, while portions of conductive material remain in the trench between source contact areas (over shallow trench isolation structures). Thus, the trench at this stage includes alternating open areas and portions of conductive material. Subsequently, further etching extends the individual openings and open areas of the trench at approximately the same rate so that both source and drain contact areas may exposed without under-etching or over-etching.

An example of a method of forming a NAND flash memory includes: forming an array of NAND flash memory cells across a surface of a silicon substrate, the NAND flash memory cells arranged in NAND strings, each NAND string extending along a first direction between a first contact area and a second contact area, neighboring NAND strings separated by shallow trench isolation structures; subsequently forming a dielectric layer over the NAND strings and the shallow trench isolation structures; subsequently performing an initial etch, thereby forming a trench in the dielectric layer over first contact areas of a plurality of NAND strings, the trench extending along a second direction that is perpendicular to the first direction, the initial etch also forming a plurality of individual openings in the dielectric layer over second contact areas of the plurality of NAND strings; subsequently adding material in the trench to reduce an area of exposed bottom surface of the trench while maintaining the plurality of individual openings without substantial reduction of bottom surface area; and subsequently performing a further etch to extend the trench and the plurality of individual openings.

The initial etch may stop at an etch stop layer that establishes a common depth of the trench and of the individual openings. The further etch may extend the trench to expose the first contact areas and may extend the plurality of individual openings to expose the second contact areas. Conductive metal may subsequently be deposited in the trench to form a common source line and in the plurality of individual openings to form individual bit line contacts. Adding the material in the trench may include filling the trench with the material and subsequently patterning and etching the material to leave first locations along the trench that are filled with the material and second locations along the trench without the material where side and bottom surfaces of the trench are exposed. The first and second locations may alternate along the second direction. The first locations may be directly over the shallow trench isolation structures and the second locations may be directly over the first contact areas of the plurality of NAND strings. The material may extend along a side of the trench. The material may be an electrically conductive material. The material may be one of: doped silicon or metal.

An example of a method of forming a NAND flash memory includes: forming an array of NAND flash memory cells across a surface of a silicon substrate, the NAND flash memory cells arranged in NAND strings, each NAND string extending along a first direction between a first contact area and a second contact area, neighboring NAND strings separated by shallow trench isolation structures; subsequently forming a dielectric layer over the NAND strings and the shallow trench isolation structures; subsequently performing an initial etch, thereby forming a trench in the dielectric layer over first contact areas of a plurality of NAND strings, the trench extending along a second direction that is perpendicular to the first direction, the initial etch also forming a plurality of individual openings in the dielectric layer over second contact areas of the plurality of NAND strings; subsequently filling the trench and the plurality of individual openings with an electrically conductive material; subsequently forming an etch mask over the trench; subsequently etching the electrically conductive material in the trench using the etch mask to expose portions of the trench while leaving filled portions in the trench, the etching removing the electrically conductive material from the plurality of individual openings; subsequently performing further etching to extend exposed portions of the trench to first contact areas and to extend the plurality of individual openings to the second contact areas; and subsequently depositing metal to form a common source line in the trench and to form individual bit line contacts in the plurality of individual openings.

An etch-stop layer may be deposited over the NAND strings and the shallow trench isolation structures. The initial etch may stop at the etch-stop layer and the further etching may extend through the etch-stop layer. The etch mask may include a plurality of mask portions that extend along the first direction over the shallow trench isolation structures to leave filled portions that overlie the shallow trench isolation structures. The filled portions may be located over each shallow trench isolation structure, or located over alternate shallow trench isolation structures. The further etching may proceed at an equal etch rate in the exposed portions of the trench and in the individual openings.

An example of a NAND flash memory includes: a plurality of NAND strings extending in a first direction along a substrate surface, an individual NAND string having a source contact area at a source end and a drain contact area at an opposing drain end; a plurality of shallow trench isolation structures extending along the first direction between the plurality of NAND strings; and a common source line extending in a second direction that is perpendicular to the first direction to connect source contact areas of the plurality of NAND strings, the common source line containing alternating portions of a metal and doped silicon along the second direction.

A plurality of drain contacts may extend from the drain contact areas of the plurality of NAND strings, each of the plurality of drain contacts formed of the metal and isolated from other ones of the plurality of drain contacts. The portions of doped silicon may overlie the plurality of shallow trench isolation structures. The portions of the metal may overlie and directly physically source contact areas of the plurality of NAND strings.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.
FIG. 2B shows a cross section of a NAND string of FIG. 2A.
FIGS. 3A-B illustrate different etch depths in prior art.
FIG. 4A-B illustrate portions of material added in a trench.
FIGS. 5A-B show source and drain areas after an initial etch.
FIGS. 6A-B show the structure of FIGS. 5A-B after deposition of amorphous silicon.
FIGS. 7A-B show the structure of FIGS. 6A-B after planarization.
FIGS. 8A-B show the structure of FIGS. 7A-B after deposition of additional layers.
FIGS. 9A-B show the structure of FIGS. 8A-B after patterning.
FIGS. 10A-B show the structure of FIGS. 9A-B after deposition of silicon oxide.
FIGS. 11A-B show the structure of FIGS. 10A-B after etching back.
FIGS. 12A-B show the structure of FIGS. 11A-B after pattern transfer.
FIGS. 13A-B show the structure of FIGS. 12A-B after deposition of another silicon oxide layer.
FIGS. 14A-B show the structure of FIGS. 13A-B after etching back.
FIGS. 15A-B show the structure of FIGS. 14A-B after patterning of amorphous silicon.
FIGS. 16A-B show the structure of FIGS. 15A-B after further etching.
FIGS. 18A-B show source and drain areas after an initial etch.
FIGS. 19A-B show the structure of FIGS. 18A-B after deposition of amorphous silicon.
FIGS. 20A-B show the structure of FIGS. 19A-B after planarization.
FIGS. 21A-B show the structure of FIGS. 20A-B after deposition and patterning of resist.
FIGS. 22A-B show the structure of FIGS. 21A-B after deposition of silicon oxide.
FIGS. 23A-B show the structure of FIGS. 22A-B after etching back.
FIGS. 24A-B show the structure of FIGS. 23A-B after patterning of material in the trench.
FIGS. 25A-B show an example of trench widening in an upper area.
FIG. 26 shows an example of a portion of material extending along the side of a trench.

DETAILED DESCRIPTION OF EXEMPLARY EMBODIMENTS

Memory System

Figure 2C:
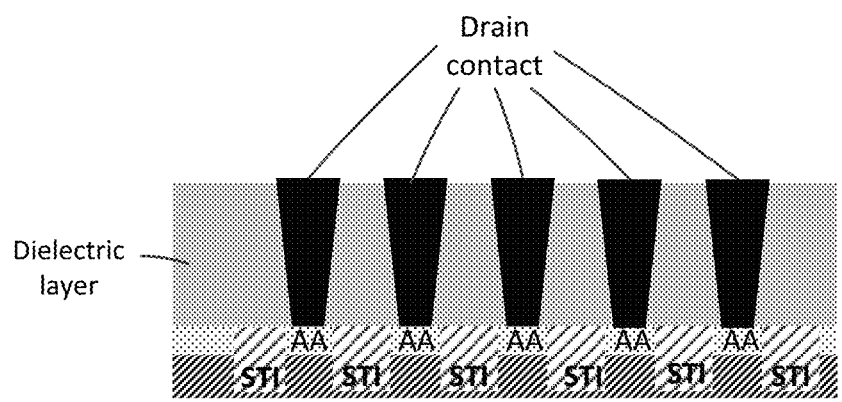
FIG. 2C is a cross section of drain contacts of FIG. 2A.
Figure 2D:
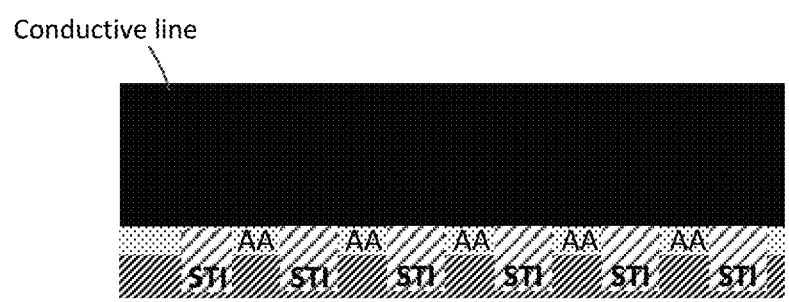
FIG. 2D is a cross section of a common source line of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2D show different views of a prior art NAND flash memory. In particular, FIG. 2A shows a plan view of a portion of such a memory array including bit lines (BL0-BL4) and word lines (this is a simplified structure with a small number of word lines and bit lines). FIG. 2B shows a cross section along B-B' (i.e. along a NAND string) showing individual memory cells that are connected in series with select transistors at each end of the NAND string. Source and drain contacts connect the NAND string shown as part of a larger memory array. In this example, the drain contact connects the drain side of the NAND string to a global bit line (not shown) that runs parallel to the NAND string at a higher metal level. The source contact connects the source side of the NAND string to a common source line that extends in a direction that is perpendicular to the NAND string (i.e. parallel to the word lines).

FIG. 2C shows a cross section along C-C' of FIG. 2A. Contacts extend up from active areas ("AA") in the substrate where the contacts make electrical contact with the doped active areas in what may be considered a drain contact areas of the NAND strings. Each of the drain contacts shown is electrically isolated from neighboring drain contacts by a dielectric layer. Global bit lines may be formed over and aligned with the contacts shown so that each NAND string is connected to a different global bit line. Thus, each of the NAND strings may have a different bias applied to its drain to allow selective accessing of cells of different NAND strings (e.g. selective programming of memory cells of some NAND strings while others are inhibited). NAND string, including their contact areas, are isolated from each other by STI structures that extend along the bit line direction between neighboring NAND strings.

In contrast to the individual contacts connecting drain ends of the NAND strings, a common contact is formed to the drain ends of the NAND strings. A conductive line extends along the cross section of FIG. 2D and forms an electrical connection to contact areas of NAND strings (active areas, "AA"). The conductive line also extends across STI structures between NAND strings and lies in contact with STI structures.

A common source line may be formed by etching a trench that exposes source contact areas and subsequently filling the trench with metal. Generally, it is more efficient to form drain contacts and source contacts (common source line) together. Thus, etching contact holes for drain contacts and etching the trench for a common source line may be performed together using common patterning and etching steps. Subsequently, a single metal deposition step may fill drain contact holes and the common source line trench with conductive metal. However, forming both of these structures in a common set of steps presents certain challenges.

FIGS. 3A and 3B show an example of drain and source contact areas respectively at the same intermediate stage of fabrication. Drain contact holes of FIG. 3A extend through a dielectric layer that includes silicon oxide ("SiO", e.g. $SiO_2$) and silicon nitride ("SiN"). Drain contact holes are offset, or staggered, in this example to maintain electrical isolation between contacts. Drain contact holes expose areas of the substrate that are doped and form drain contact areas. In general, some over-etching may result in drain contact holes extending a small amount into the substrate in order to ensure that there is no dielectric remaining on contact areas. In contrast to the drain contact holes, the source contact hole, or trench, extends significantly into the substrate in this example. The dashed line shows the level of the bottom of the drain contact hole which is at the desired depth to make a good contact (i.e. to expose the contact area cleanly without etching through the contact area). The trench extends deeper than desired and may cause problems including junction leakage at this location when the contact is in use.

In general, when etching through an etch mask (hard mask that defines an etch pattern) the etch rate may vary at different locations according to the pattern. Specifically, the microloading effect may result in a higher etch rate through larger openings in an etch mask than through smaller openings in the etch mask. In the example of FIGS. 3A and 3B this generally means that the etch rate through individual relatively small openings used to pattern drain contact holes is lower than the etch rate through the relatively large elongated opening used to pattern the common source line trench. Thus, when the etch depth is tuned to achieve good results at the drain end then over-etching may occur at the source end. If the etch depth is tuned to achieve good results at the source end then under-etching may occur at the drain end. Achieving acceptable results at both ends may be difficult.

An example of a method of achieving uniform etch depth for forming both drain contacts and source contacts is shown in FIGS. 4A and 4B, which show a perspective view and cross sectional view of a common source line trench 401 respectively. FIG. 4A shows portions of material (e.g. portion 403) extending across trench 401. The portions of material leave openings (e.g. opening 405) that may be approximately the same size as openings used to pattern drain contacts. Accordingly, etch rates through these openings are approximately the same as in the drain contact holes. Thus, source contacts may be formed to the same depth as drain contacts holes using a common set of etch and metal deposition steps.

FIG. 4B shows a cross sectional view along the plane illustrated in FIG. 4A (vertical plane along the center of trench 401). Contact areas (active areas "AA") are exposed. Between active areas, portions of material (e.g. portion 403) overlie shallow trench isolation (STI) structures. Some additional dielectric (e.g. SiN portion 407) lies between the portions of material and the STI in this example. The portions of material are formed of doped amorphous silicon (aSi) in this example so that they are electrically conductive and thus form part of the common source line after metal deposition. Thus, the portions of material in the trench 401 form individual openings that may have dimensions that are similar to drain contact openings (and thus provide similar etch rates) while maintaining an electrically continuous body along the trench when the openings are filled with metal.

An example of a method of forming source and drain contacts will now be described with respect to FIGS. 5A-B to 16A-B. It will be understood that the steps illustrated show particular steps in an example process and that other examples may also be used.

FIGS. 5A-B show drain and source contact areas respectively at an intermediate stage of fabrication. In particular, drain contact holes 511 and a common source line trench 513 have been partially etched through a dielectric layer (SiO layer 515) at this stage, stopping at a silicon nitride layer (SiN layer 517) that acts as an etch-stop layer (e.g. using an etch chemistry that has a significantly higher etch rate for silicon oxide of an upper dielectric layer than for silicon nitride). Thus, drain contact holes 511 and the source contact trench have approximately the same depth at this stage (the etch-stop layer providing a common depth even though there may be a higher etch rate in the trench). In other examples, no etch-stop layer may be necessary and an initial etch may be controlled by time alone.

FIGS. 6A-B show the structures of FIGS. 5A-B after deposition of an electrically conductive material 617 to fill the drain contact holes and the source contact trench. Doped amorphous silicon is used as the conductive material in this example. Other electrically conductive materials, such as metals, may also be used.

FIGS. 7A-B show the structures of FIGS. 6A-B after planarization of the amorphous silicon 617 to provide a uniform top surface.

FIGS. 8A-B show the structure of FIGS. 7A-B after deposition of additional layers including a resist layer 819 overlying a middle layer 821 (e.g. silicon dioxide) and under layer 823 (e.g. a carbon-based layer) on amorphous silicon layer 617. Other stacks of materials may also be used to facilitate patterning according to an appropriate patterning scheme.

FIGS. 9A-B show the structures of FIGS. 8A-B after patterning of the resist layer 819 to form a strip of resist 819a (core pattern) extending perpendicular to source contact trench 513 over the source contact area.

FIGS. 10A-B show the structures of FIGS. 9A-B after deposition of a silicon oxide layer 127 over the resist layer 819. Silicon oxide layer 127 is deposited as a blanket layer over the photoresist layer 819 over the drain contact area in FIG. 10A. Over the source contact area in FIG. 10B, the silicon oxide layer 127 lies along sides of the resist strip 819a.

FIGS. 11A-B show the structures of FIGS. 10A-B after etching back to remove silicon oxide from the over the drain contact area of FIG. 11A and over other areas where silicon oxide layer 127 extends horizontally. Photoresist 819 is also removed. Sidewall spacers 127a-b of silicon oxide remain where the silicon oxide layer 127 lay against the resist strip 819a.

FIGS. 12A-B show the structures of FIGS. 11A-B after transfer of the pattern of FIGS. 11A-B to under layer 823 (e.g. carbon-based layer) to form strips 823a-b.

FIGS. 13A-B show the structures of FIGS. 12A-B after deposition of a silicon oxide layer 331 that forms a horizontal blanket layer over the drain contact area and extends over the strips 823a-b over the source contact area in FIG. 13B.

FIGS. 14A-B show the structures of FIGS. 13A-B after etching back to leave sidewall spacers 331a-d of silicon oxide where silicon oxide layer 331 lay along sides of strips 823a-b. Strips 823a-b are also removed. Thus, four sidewall spacers are formed from the two strips, which in turn were formed form the photoresist strip 819 (in what may be referred to as a "double patterning" process).

FIGS. 15A-B show the structures of FIGS. 14A-B after etching of amorphous silicon 617, using the sidewalls 331a-d as an etch mask so that portions of amorphous silicon 617a-d remain in trench 513 at locations where sidewall spacers 331a-d extended across the trench (sidewall spacers are removed). The tops of amorphous silicon portions 617a-d are flush with the top of trench 513 in this example, which may be achieved by etching back, CMP, or otherwise cleaning or planarizing the surface. All amorphous silicon is removed from drain contact holes 511.

FIGS. 16A-B show the structures of FIGS. 15A-B after a subsequent anisotropic etch to extend the drain contact holes 511 to the drain contact areas and to extend openings between amorphous silicon portions 617a-d to the source contact areas. Because the openings between amorphous silicon portions 617a-d are approximately the same size as the drain contact holes, both are etched to the same depth and the process can be tuned to achieve good contacts at both ends. Subsequently, metal may be deposited over the structure shown to form metal drain contacts and to form a common source line that alternates between metal and doped (electrically conductive) amorphous silicon.

In order to ensure exposure of source contact areas, the openings in the source contact trench align with the source contact areas. Thus, the resist strip, and resulting silicon oxide strips and sidewall spacers are aligned with the AA and STI pattern in the substrate (see FIG. 4B).

Figures 17A, 17B:
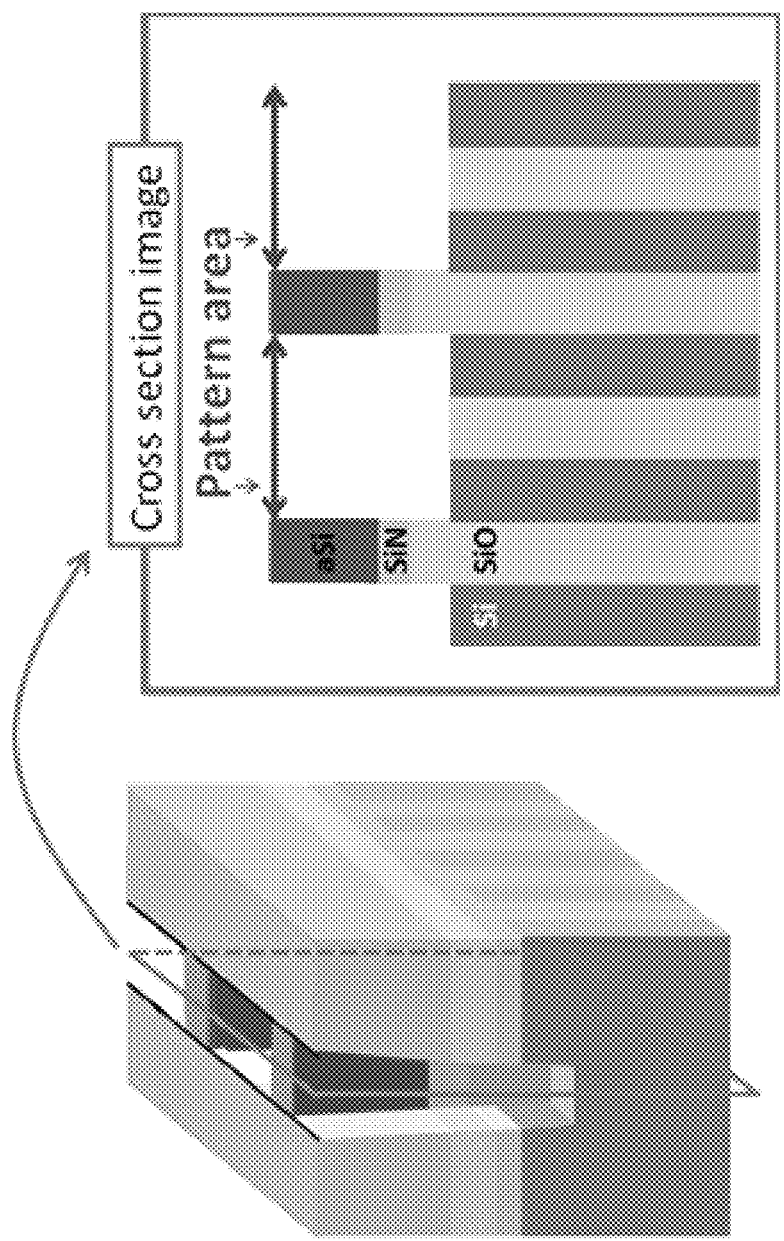
FIGS. 17A-B show an alternative arrangement of portions of amorphous silicon.

While the example of FIGS. 5A-B to 16A-B shows a portion of amorphous silicon over every STI structure (a portion between every pair of neighboring contact areas) other arrangements are also possible. FIGS. 17A-B show an example where portions of amorphous silicon are located over alternate STI structures (i.e. over every other STI structure, for example, only over evenly numbered, or only over odd numbered, STI structures). Depending on the dimensions of the drain contact openings and the source contact trench, this arrangement may better provide an etch rate that is equal to, or nearly equal to, the etch rate in the drain contact openings. In other examples, a portion of amorphous silicon, or other suitable material, may be provided over every third STI structure. In other examples, other spacing may be provided (e.g. every fourth, fifth, sixth, etc.).

A process for forming the structure of FIGS. 17A-B will now be described with respect to FIGS. 18A-B to 24A-B.

FIGS. 18A-B show drain and source contact areas respectively at an intermediate stage of fabrication. In particular, drain contact holes 511 and a common source line trench 513 have been partially etched through a dielectric layer at this stage, stopping at a silicon nitride layer 517 that acts as an etch-stop layer (e.g. using an etch chemistry that has a significantly higher etch rate for silicon oxide of an upper dielectric layer than for silicon nitride). Thus, drain contact holes 511 and the source contact trench have approximately the same depth at this stage (the etch-stop layer providing a common depth even though there may be a higher etch rate in the trench).

FIGS. 19A-B show the structures of FIGS. 18A-B after deposition of an electrically conductive material 617 to fill the drain contact holes 511 and the source contact trench 513. Doped amorphous silicon is used as the conductive material in this example. Other electrically conductive materials, such as metals, may also be used.

FIGS. 20A-B show the structures of FIGS. 19A-B after planarization of the amorphous silicon layer 617 to provide a uniform top surface.

FIGS. 21A-B show the structure of FIGS. 20A-B after deposition and patterning of a resist layer 751 to form resist strip 751a (core pattern). In contrast to the previous example, the resist layer 751 is deposited directly on the amorphous silicon 617 in this example.

FIGS. 22A-B show the structures of FIGS. 21A-B after deposition of a silicon oxide layer 753 over the resist layer 751. The silicon oxide layer 753 is deposited as a blanket layer over the photoresist layer 751 over the drain contact area. Over the source contact area, the silicon oxide lies along sides of the resist strip 751a.

FIGS. 23A-B show the structures of FIGS. 22A-B after etching back to remove silicon oxide from the over the drain contact area of FIG. 22A and over other areas where the silicon oxide layer 753 extends horizontally. Photoresist layer 751 is also removed. Silicon oxide sidewall spacers 753a-b remain where the silicon oxide layer 753 lay against the resist strip 751a.

FIGS. 24A-B show the structures of FIGS. 23A-B after etching of amorphous silicon 617, using the sidewall spacers 753a-b as an etch mask so that portions of amorphous silicon 771a-b remain in the trench at locations where sidewall spacers 753a-b extended across the trench (sidewall spacers are removed). The tops of amorphous silicon portions 771a-b are flush with the top of the trench in this example, which may be achieved by etching back, CMP, or otherwise cleaning or planarizing the surface It can be seen that this process uses a single sidewall spacer step where the previous process used a two sidewall spacer steps (double patterning). The result is a pattern that provides a portion of amorphous silicon over every other STI structure as shown. In other examples, direct patterning (without sidewall spacers) may be used.

In some cases, the electrical conductance of doped amorphous silicon may be sufficient so that a common source line formed of alternating portions of amorphous silicon and metal has an acceptable resistance. In other cases, it may be desirable to reduce the resistance of such a line. Additional conductive material may be added at an appropriate location to reduce the resistance along such a line.

FIGS. 25A-B show an example in which, after formation of portions 951a-d of conductive material in a trench 953, the trench is widened in an upper area so that trench 953 is wider than the portions 951a-d of conductive material near the top of the trench. Thus, after metal deposition, this volume is filled with metal so that continuous strips of metal extend along the source line at this level. Such metal strips, in parallel with the alternating metal/amorphous silicon structure in the original trench, may provide reduced resistance along the common source line.

While the above examples show portions of material extending across a trench to divide the trench into multiple smaller openings and thus reduce etch rate in the trench, the size of an opening may be reduced without separating the opening into multiple smaller openings.

FIG. 26 shows an example of a portion of amorphous silicon 961 (aSi) that extends along a side of a trench 963 to reduce the etch rate at the bottom of trench 963. Thus, after a trench is partially formed by etching down to an etch stop layer, the trench size may be reduced by depositing amorphous silicon along one side of the trench (as shown) or both sides. Subsequently, when another etch step extends the trench, the reduced opening size reduces the etch rate to a desired etch rate that matches, or approximates, the etch rate in corresponding drain contact holes.

Figure 27:
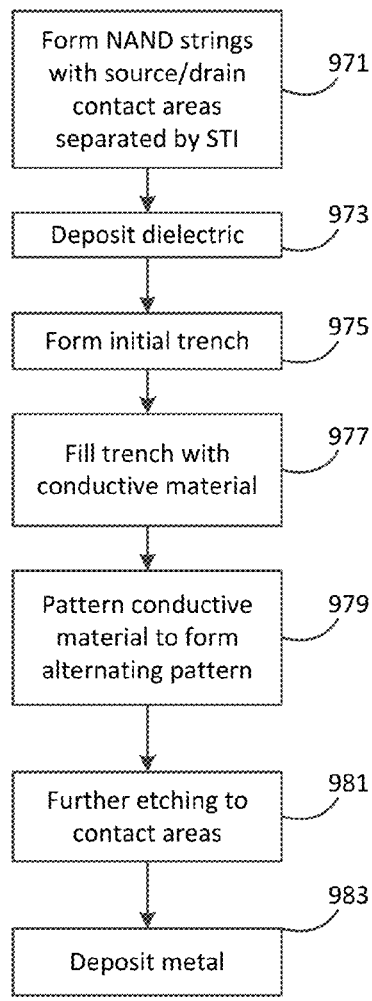
FIG. 27 shows an example of process steps used to form a source and drain contacts.

FIG. 27 illustrates a series of steps that may be used to form source and drain contacts of uniform depth. NAND strings are formed 971 with source and drain contact areas in a substrate at either end. Subsequently dielectric is deposited 973 over the structure so that source and drain contact areas are covered by one or more dielectric layers (e.g. silicon oxide with a silicon nitride etch-stop layer or other suitable stack). An initial trench is etched 975 down to the silicon nitride etch-stop layer in parallel with etching drain contact holes to the same etch-stop layer. The trench and drain contact holes are then filled with electrically conductive material 977 (e.g. doped amorphous silicon). The conductive material is then patterned 979 to (e.g. by direct patterning, sidewall spacers, or double sidewall spacers) to form an alternating pattern that is aligned so that portions of conductive material overlie STI structures and openings overlie source contact areas. Subsequently, further etching is performed 981 to extend the trench and expose the source and drain contact areas. This etching achieves a similar etch depth at both source and drain ends because opening geometry in the source contact trench has been made to approximate the geometry of drain contact holes. Subsequently, metal is deposited 983 to fill openings between portions of conductive material in the source contact trench and to fill drain contact holes.

Figure 28:
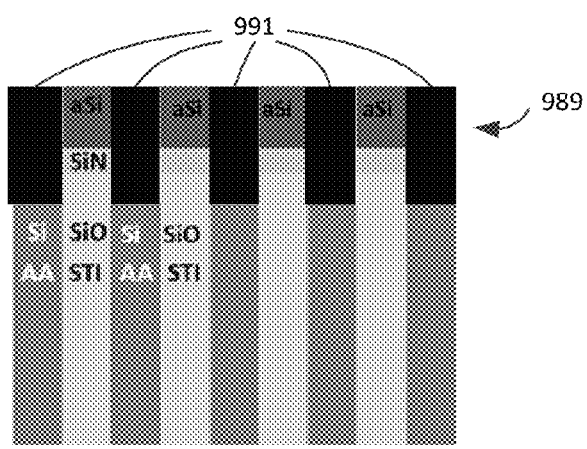
FIG. 28 shows an example of a common source line with alternating structure.

FIG. 28 shows an example of a common source line 989 that extends perpendicular to NAND strings and connects to source contact areas ("Si AA") of NAND strings. Source line 989 contains alternating portions of metal 991 and doped amorphous silicon ("aSi"), with the amorphous silicon overlying STI structures and metal portions 991 making contact with source contact areas.

CONCLUSION

Although the various aspects have been described with respect to examples, it will be understood that protection within the full scope of the appended claims is appropriate.

The invention claimed is:

1. A method of forming a NAND flash memory comprising:
   forming an array of NAND flash memory cells across a surface of a silicon substrate, the NAND flash memory cells arranged in NAND strings, each NAND string extending along a first direction between a first contact area and a second contact area, neighboring NAND strings separated by shallow trench isolation structures;
   subsequently forming a dielectric layer over the NAND strings and the shallow trench isolation structures;
   subsequently performing an initial etch, thereby forming a trench in the dielectric layer over first contact areas of a plurality of NAND strings, the trench extending along a second direction that is perpendicular to the first direction, the initial etch also forming a plurality of individual openings in the dielectric layer over second contact areas of the plurality of NAND strings;
   subsequently adding material in the trench to reduce an area of exposed bottom surface of the trench while maintaining the plurality of individual openings without substantial reduction of bottom surface area, wherein adding the material in the trench comprises filling the trench with the material and subsequently patterning and etching the material to leave first locations along the trench that are filled with the material and second locations along the trench without the material where side and bottom surfaces of the trench are exposed; and
   subsequently performing a further etch to extend the trench and the plurality of individual openings.

2. The method of claim 1 wherein the initial etch stops at an etch stop layer that establishes a common depth of the trench and of the individual openings.

3. The method of claim 2 wherein the further etch extends the trench to expose the first contact areas and extends the plurality of individual openings to expose the second contact areas.

4. The method of claim 1 further comprising, subsequently depositing conductive metal in the trench to form a common source line and in the plurality of individual openings to form individual bit line contacts.

5. The method of claim 1 wherein the first and second locations alternate along the second direction.

6. The method of claim 5 wherein the first locations are directly over the shallow trench isolation structures and the second locations are directly over the first contact areas of the plurality of NAND strings.

7. The method of claim 1 wherein the material extends along a side of the trench.

8. A method of forming a NAND flash memory comprising:
   forming an array of NAND flash memory cells across a surface of a silicon substrate, the NAND flash memory cells arranged in NAND strings, each NAND string extending along a first direction between a first contact area and a second contact area, neighboring NAND strings separated by shallow trench isolation structures;
   subsequently forming a dielectric layer over the NAND strings and the shallow trench isolation structures;
   subsequently performing an initial etch, thereby forming a trench in the dielectric layer over first contact areas of a plurality of NAND strings, the trench extending along a second direction that is perpendicular to the first direction, the initial etch also forming a plurality of individual openings in the dielectric layer over second contact areas of the plurality of NAND strings;
   subsequently adding material in the trench to reduce an area of exposed bottom surface of the trench while maintaining the plurality of individual openings without substantial reduction of bottom surface area, wherein the material is an electrically conductive material; and
   subsequently performing a further etch to extend the trench and the plurality of individual openings.

9. The method of claim 8 wherein the material is one of: doped silicon or metal.

10. A method of forming a NAND flash memory comprising:
    forming an array of NAND flash memory cells across a surface of a silicon substrate, the NAND flash memory cells arranged in NAND strings, each NAND string extending along a first direction between a first contact area and a second contact area, neighboring NAND strings separated by shallow trench isolation structures;
    subsequently forming a dielectric layer over the NAND strings and the shallow trench isolation structures;
    subsequently performing an initial etch, thereby forming a trench in the dielectric layer over first contact areas of a plurality of NAND strings, the trench extending along a second direction that is perpendicular to the first direction, the initial etch also forming a plurality of individual openings in the dielectric layer over second contact areas of the plurality of NAND strings;
    subsequently filling the trench and the plurality of individual openings with an electrically conductive material;
    subsequently forming an etch mask over the trench;
    subsequently etching the electrically conductive material in the trench using the etch mask to expose portions of the trench while leaving filled portions in the trench, the etching removing the electrically conductive material from the plurality of individual openings;
    subsequently performing further etching to extend exposed portions of the trench to first contact areas and to extend the plurality of individual openings to the second contact areas; and
    subsequently depositing metal to form a common source line in the trench and to form individual bit line contacts in the plurality of individual openings.

11. The method of claim 10 further comprising depositing an etch-stop layer over the NAND strings and the shallow trench isolation structures.

12. The method of claim 11 wherein the initial etch stops at the etch-stop layer and the further etching extends through the etch-stop layer.

13. The method of claim 10 wherein the etch mask includes a plurality of mask portions that extend along the first direction over the shallow trench isolation structures to leave filled portions that overlie the shallow trench isolation structures.

14. The method of claim 10 wherein the filled portions are located over each shallow trench isolation structure, or located over alternate shallow trench isolation structures.

15. The method of claim 10 wherein the further etching proceeds at an equal etch rate in the exposed portions of the trench and in the individual openings.

* * * * *